United States Patent [19]
Das

[11] Patent Number: 5,916,384
[45] Date of Patent: Jun. 29, 1999

[54] PROCESS FOR THE PREPARATION OF NICKEL BASE SUPERALLOYS BY BRAZING A PLURALITY OF MOLDED CAVITIES

[75] Inventor: Niranjan Das, Hyderabad, India

[73] Assignee: The Controller, Research & Development Organization, New Delhi, India

[21] Appl. No.: 08/813,335

[22] Filed: Mar. 7, 1997

[51] Int. Cl.$^6$ ........................................................ B23P 15/04
[52] U.S. Cl. ........................ 148/522; 148/528; 148/562; 148/555; 29/889.21; 29/889.22; 29/889.71; 29/889.721; 164/122.2
[58] Field of Search ................................. 148/522, 528, 148/562, 555; 29/889.21, 889.22, 889.71, 889.72, 889.721; 164/122.1, 122.2

[56] References Cited

U.S. PATENT DOCUMENTS

| | | | |
|---|---|---|---|
| 3,615,920 | 10/1971 | Talento | 148/528 |
| 4,507,051 | 3/1985 | Lesgourgues et al. | 416/97 R |
| 5,077,141 | 12/1991 | Naik et al. | 148/404 |
| 5,226,982 | 7/1993 | Eylon | 148/522 |
| 5,366,695 | 11/1994 | Erikson | 420/443 |

*Primary Examiner*—Margery Phipps
*Attorney, Agent, or Firm*—Venable; George S. Spencer; Ashley J. Wells

[57] ABSTRACT

A process for preparing a Ni-based superalloy cast article includes (a) preparing an alloy charge composed of from 1.4 to 4.4 wt. % of Cr, from 3 to 8 wt. % of Co, from 5 to 7.5 wt. % of W, from 4.8 to 7.5 wt. % of Re, from 6 to 9 wt. % of Ta, from 4.8 to 6 wt. % of Al, from 0.1 to 0.5 wt. % of Nb, from 0.8 to 1.8 wt. % of Hf, from 0.05 to 0.1 wt. % of C, from 0.01 to 0.05 wt. % of Y, from 0.005 to 0.15 wt. % of B, and balance Ni, wherein the sum of W+Re is about 12 wt. %, the sum of Al+Ta+Hf+Nb ranges from 13.6 to 15.6 wt. %, and the sum of W+Re+Ta+Hf+Nb ranges from 20.2 to 22.8 wt. %; (b) melting the alloy charge in a furnace to provide an alloy melt; (c) pouring the alloy melt into a mold having a plurality of cavities which define at least one pair of longitudinal halves of the article to be cast; (d) withdrawing the mold containing the alloy melt from the furnace so as to induce solidification of the alloy melt to provide at least one pair of cast longitudinal halves of an article; (e) removing the mold and cleaning the at least one pair of cast longitudinal halves; (f) providing a brazing filler between the cast longitudinal halves of each pair of the at least one pair of cast longitudinal halves along their matching plane of slice to provide an assembly; (g) subjecting each assembly to solution heat treatment and brazing to provide an article; (h) quenching the article; and (i) subjecting the article to a multi-step ageing treatment.

11 Claims, 5 Drawing Sheets

PROCESS FOR THE PREPARATION OF NICKEL BASE SUPERALLOYS BY BRAZING A PLURALITY OF MOLDED CAVITIES

BACKGROUND OF THE INVENTION

1. Field of the Invention

This invention relates to a process for the preparation of Nickel base superalloys and articles made thereof.

2. Description of the Related Art

The performance of gas turbine engines is limited by the high temperature capability of turbine blades and nozzle guide vanes (NGV) in the engines. A hot combustion gas-air mixture containing highly corrosive ingredients is directed at high pressure and velocity against the NGV parts in such engines. This hot gas then expands through the turbine blades and imparts its kinetic energy to the rotating turbine blades. Gas turbine blades and vanes therefore operate in extermely hostile environment of high temperatures, high stresses, oxidation and hot corrosion and accordingly, the materials development for such a critical application has been quite challenging. The directionally solidified (DS) columnar grained alloy CM 247 LC has been successfully used in the prior art Up to blade or vane metal temperature of about 1070° C. Further improvement was possible after partial substitution of W and Cr from the CM 247 LC alloy composition by 3 wt. % of Re to result in the second generation columnar grained alloy CM 186 LC. About 16° C. improvement over the temperature capability of CM 247 LC could be realised by the CM 186 LC alloy. This advantage is attributed to the presence of Re and a higher total refractory elements of 16 wt. % compared to that of 14.6 wt. % of CM 247 LC. Modern aero-engines with most advanced single crystal superalloys in their first stage turbine components however required far greater temperature capability than that of the CM 186 LC alloy for their subsequent stages of turbine parts which are often impractical to cast in single from.

Another disadvantage of the processes known in the prior art for preparing a hollow columnar grained component is the requirement of ceramic cores which leads to higher rejection of components.

Yet another disadvantage of the processes known in the art is the molten alloy and ceramic core reaction that leads to appreciable loss of key alloying elements which in turn deteriorates materials performance. Further disadvantage with the columnar grained materials of prior art is that a good fraction of Re and other refractory elements are not utilized for creep resistance as they are locked up in a coarse gamma prime phase, whose solutionization often leads to recrystallization and deleterious phase formation and deteriorates creep resistance.

The primary object of the present invention is to propose Ni-base superalloys and articles made therefrom with higher refractory element content beyond that of the CM 186 LC alloy in order to achieve superior creep resistance for applications such as gas turbine blades and vanes with adequate resistance to oxidation, hot-corrosion and deleterious phase formation.

Another object of the present invention is to propose Ni-base superalloys and articles made therefrom with excellent castability for advanced gas turbine blades and vanes in polycrystalline form having thin walled aero-foils, shrouded segments and intricate cooling channels.

A further object of the present invention is to propose a process for preparation of hollow columnar grained turbine components having complex cooling channels without employing ceramic cores and improving the yield of quality components.

Yet a further object of the present invention is to propose a process for preparation of hollow columnar grained materials which can be heat treated without causing any recrystallization to achieve improved balance of critical mechanical properties for advanced gas turbine engine application.

A still further object of the present invention is to propose columnar grained materials which can be conveniently brazed and given protective coating by existing manufacturing techniques during heat treatment.

Another object of this invention is to propose a columnar grained alloy composition out of the most advanced single crystal alloy chemistry and ensure thereby component castability as well as performance superiority over prior art materials.

These and other objects and advantages will be more clearly understood from the following detailed descriptions drawings and specific examples which are intended to be typical of, rather than in any way limiting on the scope of the present invention.

SUMMARY OF THE INVENTION

According to this invention there is provided a Nickel base super alloy comprising, weight %, 1.4 to 4.4. Cr, 3–8 Co, 5–7.5 W, 4.8–7.5 Re, 6–9 Ta, 4.8–6 Al, 0.1–0.5 Nb, 0.8–1.8 Hf, 0.05–0.1 C, 0.01–0.05 Y, 0.005–0.015 B, the balance being Nickel.

In accordance with the present invention, the sum of the weight percentage of W+Re in the superalloy is about 12. The sum of the weight percentage of Al+Ta+Hf+Nb in the superalloy is from 13.6–15.6 and the total refractory element (W+Re+Hf+Nb) content is from about 20.2 to 22.63, the alloy being substantially free of S and V. The alloy preferably comprises a uniform distribution of $Ni_3Al$ type cubical Y' particles in a gamma (Y) matrix of Ni-base solid solution together with carbides.

The preferred range of the alloying elements which leads to producing further optimized properties comprises, by weight percent, from about 1.8–3.8 Cr, 4–6.4 Co, 5.2–6.8 W, 5.8–7.2 Re, 6–9 Ta, 5.2–5.9 Al, 0.8–1.6 Hf, 0.1–0.5 Nb, 0.06–0.1 C, 0.015–0.045 Y, 0.005–0.015B, balance essentially Ni, wherein the sum of W+Re is about 12, the sum of Al+Ta+Hf+Nb is from about 13.6 to 15.6 and the total refractory element content is between 20.2 and 22.5, the alloy being substantially free of S and V.

The most preferred range of composition by weight percent is essentially 1.8 to 3 Cr 4 to 6.4 Co, 5.2 to 6 W, 6 to 7.2 Re, 6.5 to 9 Ta, 5.2 to 5.5 Al, 0.8 to 1.6 Hf, 0.1 to 0.3 Nb, 0.07 to 0.1 C. 0.015 to 0.04 Y, 0.01 to 0.015 B, balance being essentially Ni wherein the sum of W+Re is about 12 the sum of Al+Ta+Hf+Nb is in the range of 13.6 to 15.6 and the total refractory element (W+Re+Hf+Nb) content is in the range of 20.2 to 22.5, the alloy being substantially free of S and V.

Further according to the present invention there is provided a process for the preparation of Ni-based superalloy article comprising the steps of:

a) preparing an alloy charge by adding, in weight percent, 1.4–4.4 Cr, 3–8 Co, 5–7.5 W, 4.8–7.5 Re, 6–9 Ta, 4.8–6 Al, 0.1–0.5 Nb, 0.8–1.8 Hf, 0.05–0.1 C, 0.01–0.05 Y, 0.005–0.015 B the balance being Ni;

b) melting the alloy charge prepared by step (a):

c) pouring the said melt into a mould;

d) withdrawing the mould containing melt;

e) subjecting the melt to a step of freezing;

f) removing and cleaning each pair of cast longitudinal halves and subjecting them to solution heat treatment;

g) subjecting the brazed and solutionised components obtained by steps (f) to a step of quenching;

h) subjecting the above to a multistep ageing treatment.

Further in accordance with the present invention a Nickel base superalloy charge is prepared by adding, in weight %, 1.4 to 4.4 Cr, 3–8 Co, 5–7.5 W, 4.8–7.5 Re, 6–9 Ta, 4.8–6 Al , 0.1–0.5 Nb, 0.8–1.8 Hf, 0.05–0.1 C, 0.01–0.05 Y, 0.005–0.015 B, the balance being Nickel, with W+Re being 12, Al+Ta+Hf+Nb being 13.6–15.6 and total refractory elements W+Re+Ta+Hf+Nb being 20.2–22.8 in a vaccum induction melting furnace at a temperature for example 1500° C. The melt is then poured into a mould. The mould has several cavities in pairs of two longitudinal halves of each component; each pair being connected at the bottom to a central sprue through bottom runners.

The mould is preheated to a temperature of, for example 1500° C. in a vacuum melting and casting furnace and then the melt is poured into the mould.

The mould containing melt is withdrawn from the mould-heater of the vacuum melting and casting furnace, across a temperature gradient so as to induce directional freezing of the melts, either by radiactive heat transfer to the water-cooled furnace chamber or by conduction into a low melting pool of liquid metal such as aluminum.

Each pair of cast longitudinal halves is removed and cleaned and then subjected to solution heat treatment in a stepped manner between about 1275° C. to 1295° C. for about 24 hours, the peak soaking temperature being at least 10° C. below the alloy incipient melting temperature. During this solution heat treatment, the two cast halves are held against each other long their matching plane of slice incorporating desirable braze-filler material so that a complete single crystal component having intricate cooling channels would form by brazing of the two halves simultaneously along with solutionisation. The solution heat treatment dissolves the irregular Y-particles and most or all of the eutectic-Y into the Y-matrix depending upon the casting geometry and casting conditions of the article.

The brazed and solutionised components are subjected to argon gas fan quenching followed by a multi-step ageing treatment in order to precipitate the Y'-particles within the Y-matrix. In the first step the components are heated to about 1170° C. and held there for about 4 hours. In the next ageing-step, the components are given simulated coating treatment of holding at about 1140° C. for about 4 hours. Next, the components are aged at about 870° C. for about 20 hours and finally cooled down to the ambient temperature. The ageing treatment is not limited to this preferred heat treatment sequence, but instead may be accomplished by any acceptable manner which provides the desired volume fraction of Y'-particles in a somewhat regular array, cubical shape and uniform size around 0.5 μm.

Based upon an evaluation of alloys prepared in accordance with the invention, preferred and most preferred ranges of alloying elements have been determined. The evaluation procedures are described in connection with the examples to be presented subsequently. The preferred range of composition in wt. % consists essentially of from about 1.8 to 3.8 Cr, 4 to 6.4 Co, 5.2 to 6.8 W, 5.8 to 7.2 Re, 6 to 9 Ta, 5.2 to 5.9 Al , 0.8 to 1.6 Hl, 0.1 to 0.5 Nb, 0.06 to 0.1C, 0.015 to 0.045 Y, 0.005 to 0.015 B, balance Ni, wherein the sum of W+Re is about 12, the sum of Al+Ta+Hf +Nb is from about 13.6 to 15.6 and the total refractory elements (W+Re+Hf+Nb) is between 20.2 and 22.5, the article being substantially free from S and V. It is found that this preferred range provides improved combination of critical properties relative to what have been obtained in columnar grained superalloy articles of the prior art.

The most preferred range of composition by weight percent is essentially 1.8 to 3 Cr, 5 to 6.4 Co, 5.2 to 6 W, 6 to 7.2 Re, 6.5 to 9 Ta, 5.2 to 5.5 Al, 0.8 to 1.6 Hf, 0.1 to 0.3 Nb, 0.07 to 0.01C, 0.0156 to 0.04 Y, 0.01 to 0.015 B, balance being essentially Ni, wherein the sum of W+Re is about 12, the sum of Al+Ta+Hf+Nb is in the range of 13.6 to 15.6 and the total refractory element (W+Re+Hf+Nb) content is in the range of 20.2 to 22.5, the alloy being substantially free of S and V.

The articles of the present invention are particularly suitable for use as turbine blades and vanes :owing to their excellent high temperature mechanical and environmental properties, as well as their alloy phase stability. Other features and advantages of the present invention will become apparent from more detailed descriptions, taken in conjunction with the accompanying drawings, which illustrate, by way of example, the principles of the invention.

Table 1 and 2 show chemical composition, creep-rupture behavior, oxidation and hot-corrosion weight losses for a number of prior art columnar grained superalloys (ref. 1 & 2) and for the alloys prepared in the present invention. The alloys with designations as DMD-1, DMD-2, DMD-3, DMD-4, DMD-5 and DMD-6 are the examples in the board range. The preferred range includes the alloys designated as DMD-2, DMD-3, DMD-4, DMD-5. The alloy DMD-3, DMD-4, DMD-5 are in the most preferred range of composition.

TABLE 1

Nominal composition in weight percent

| Alloy | Cr | Co | W | Re | Ta | Nb | Hf | Y | Al | C | B | Ni |
|---|---|---|---|---|---|---|---|---|---|---|---|---|
| DMD-1 | 4.4 | 8 | 7.5 | 4.8 | 7 | 0.2 | 1.4 | 0.03 | 5.48 | 0.08 | 0.01 | bal |
| DMD-2 | 3.8 | 4.8 | 6.8 | 5.8 | 6 | 0.5 | 1.6 | 0.045 | 5.89 | 0.06 | 0.005 | bal |
| DMD-3 | 3.0 | 4.5 | 6 | 6 | 6.5 | 0.1 | 1.6 | 0.015 | 5.37 | 0.1 | 0.015 | bal |
| DMD-4 | 2.4 | 4 | 5.5 | 6.5 | 8 | 0.3 | 1.2 | 0.04 | 5.18 | 0.07 | 0.01 | bal |
| DMD-5 | 1.8 | 6.4 | 5.2 | 7.2 | 9 | 0.3 | 0.8 | 0.21 | 5.50 | 0.08 | 0.01 | bal |
| DMD-6 | 1.4 | 3.1 | 5 | 7.5 | 8.2 | 0.3 | 1.8 | 0.02 | 4.79 | 0.09 | 0.01 | bal |
| CM247LC* | 8.1 | 9.2 | 9.5 | — | 3.2 | — | 1.4 | — | 5.6 | 0.07 | 0.015 | bal |
| CM186LC# | 6 | 9 | 8 | 3 | 3 | — | 1.4 | — | 5.7 | 0.07 | 0.015 | bal |

*Ti: 0.7; Mo: 0.5; Zr: 0.01; #Ti: 0.7; Mo: 0.5; Zr: 0.005

TABLE 2

Creep-rupture Life (hours), Hot corrosion & oxidation weight loss

| Alloy | 500 MPa at 850° C. | 240 MPa at 950° C. | 140 MPa at 1050° C. | 120 MPa at 1100° C. | 90 MPa at 1150° C. | Corrosion weight loss ($mg/cm^2$) | Oxidation weight loss ($mg/cm^2$) |
|---|---|---|---|---|---|---|---|
| DMD-1 | 1082 | 1378 | 324 | 87 | 79 | 334 | 6.8 |
| DMD-2 | 1120 | 1402 | 354 | 113 | 91 | 367 | 6.3 |
| DMD-3 | 1178 | 1448 | 385 | 134 | 103 | 446 | 8.9 |
| DMD-4 | 1228 | 1498 | 415 | 154 | 123 | 498 | 8.4 |
| DMD-5 | 1073 | 1338 | 312 | 76 | 62 | 112 | 6.3 |
| DMD-6 | 985 | 1221 | 293 | 57 | 48 | 104 | 6.1 |
| CM247LC | 180 | 161 | 56 | 20 | — | 572 | 7.8 |
| CM186LC | 756 | 773 | 178 | 70 | 44 | 356 | 7.2 |

DESCRIPTION OF THE PREFERRED EMBODIMENTS

Figure 1:
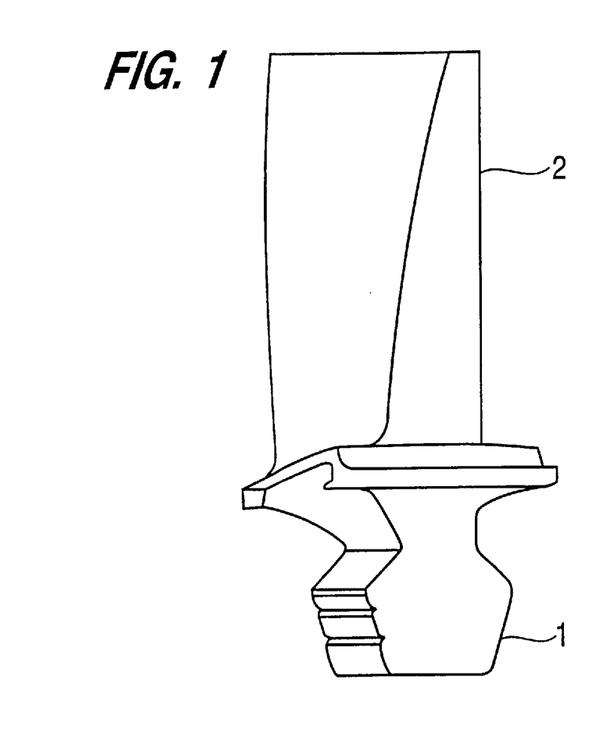
FIG. 1 is a perspective view of a gas turbine blade.
Figure 2:
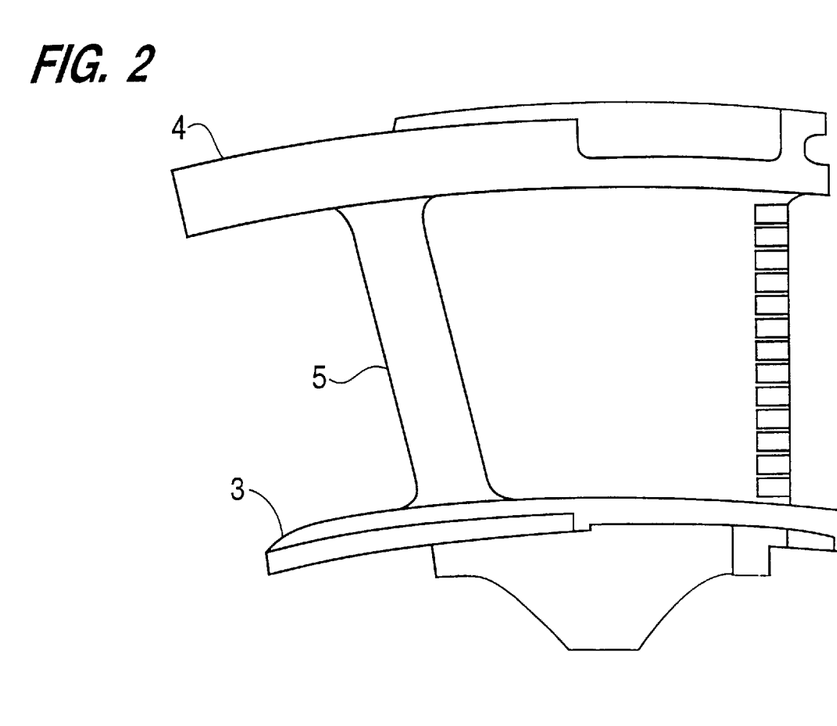
FIG. 2 is a perspective view of a gas turbine vane.

As shown in a columnar grained Ni-base superalloy article, such as a turbine blade or vane used in a gas turbine engine, the blade has a root section 1 for attachment to a turbine wheel (not shown) and the vane has an inner shroud 3 and an outer shroud 4 to respectively form the inner and outer rings upon assembly. The blade and the vane also have hollow aerofoil sections 2 and 5 respectively upon which a hot gas stream impinges. The gas swept areas of these articles are typically coated with a thin layer of an oxidation and corrosion resistance coating of about 100 μm thickness. The present invention is concerned with the underlying component or substrate, and not with the coating. Nevertheless, the substrate alloy composition and structure are chosen so as to be compatible with the necessary coatings.

Figure 3:
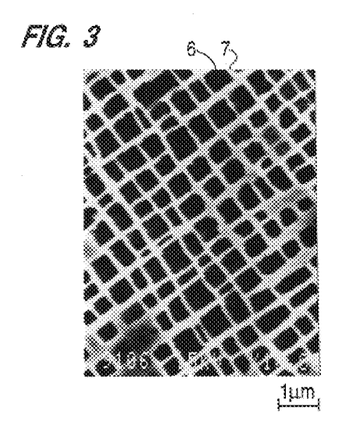
FIG. 3 is a sectional micro-graph of a columnar grained superallcy made in accordance with a preferred embodiment of the invention.

The article of the present invention, such as the turbine blade or vane, is formed by growing several columnar grains having <001> crystallographic growth texture which are nearly parallel to the major stress axis. As illustrated in FIG. 3, the completed article is typically comprised of three phases, a precipitate 6 formed within a matrix 7 together with carbides 8. The microstructure may also contain minute fraction of eutectic phase 9 formed during solidification of the article and does not dissolve completely during heat treatment. These eutectic regions are often associated with metallic carbides which can also be present in grain boundaries between two columnar grains.

Figure 5:
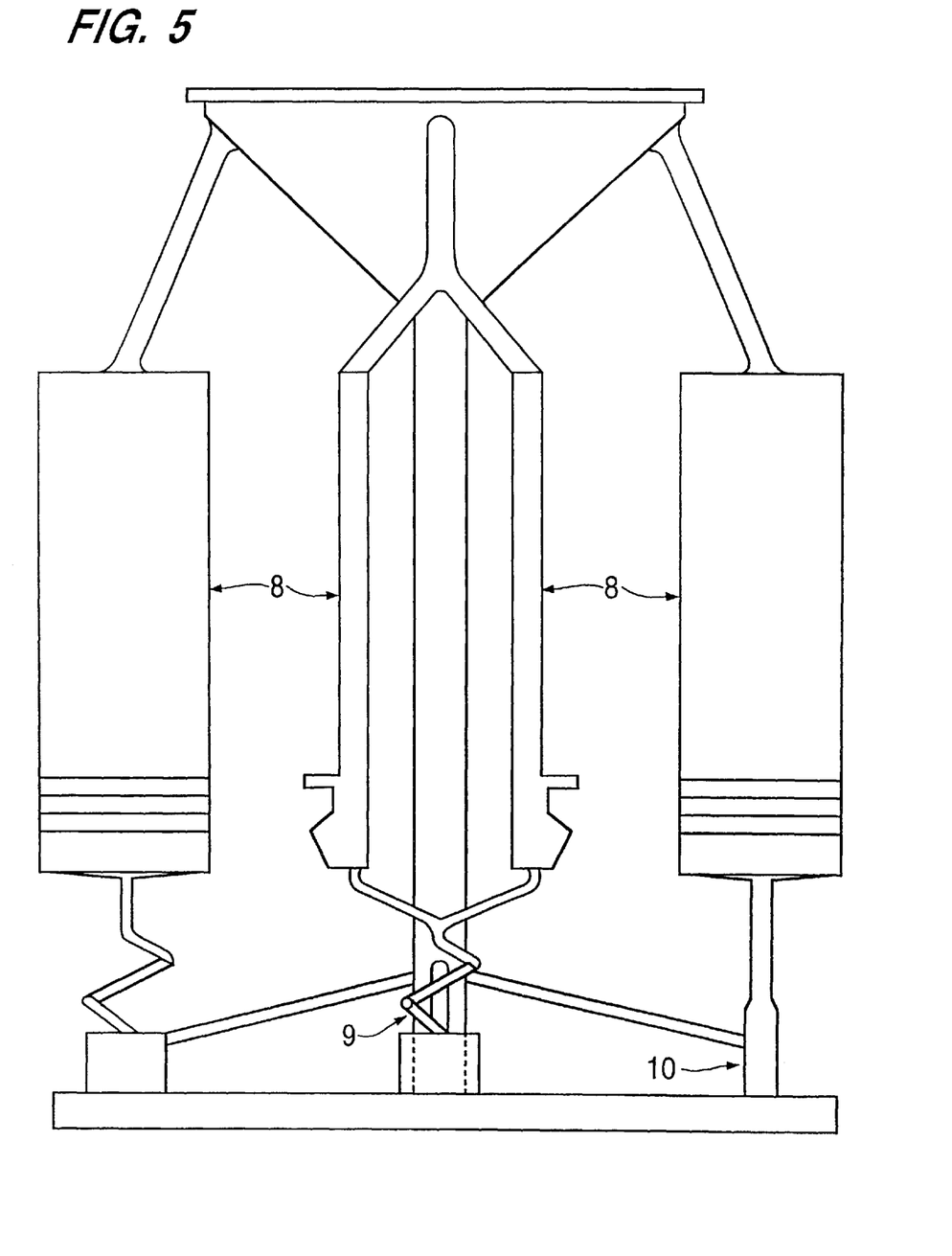
FIG. 5 is a schematic of wax cluster design for growing several pairs of columnar grained longitudinal halves of components.

Any fabrication technique which produces a substantially collumnar grained article is operable in conjunction with the present invention. The preferred technique, used to prepare the columnar grained articles described through the examples herein, is to prepare the molten metal of desired composition and pour the melt into a hot (about 1500° C.) refractory shell mould having cavities corresponding to the wax cluster design as shown schematically in FIG. 5. The mould thus has a central pouring cup (10) and sprue (11) that is connected to several cavities of desired shape in pairs of longitudinal halves (12) of each component through bottom runners (13). The metal and mould are heated electrically in a vacuum furnace and are withdrawn across a temperature gradient in order to induce directional freezing either by radiating heat to the water cooled chamber wall or by conduction into a liquid pool of low melting metal. Each pair of longitudinal component halves are then brazed during heat treatment to form hollow columnar grained components.

The alloy composition that has been found suitable for the above mentioned processing conditions and provides far greater creep resistance than the columnar grained superalloys of the prior art along with adequate corrosion resistance, as well as oxidation reistance, has been derived from the most advanced single crystal superallcoy composition. The columnar grained alloy composition of this invention essentially incorporates grain boundary strengtheners such as C & B in trace-quantities and Hf in sufficient quantity into the above mentioned single crystal alloy composition in order to achieve columnar grain castability and grain boundary strength. The rise in Hf-level has been compensated for with a lower Ta-content in a columnar grained alloy relative to that of single crystal alloy so that the resulting phase boundaries of columnar grained alloy will deviate to the minimum extent from those of the the single crystal alloy. Table 1 provides a number of alloying combinations in this broad range which are designated from DMD-1 up to DMD-6.

Figure 4:
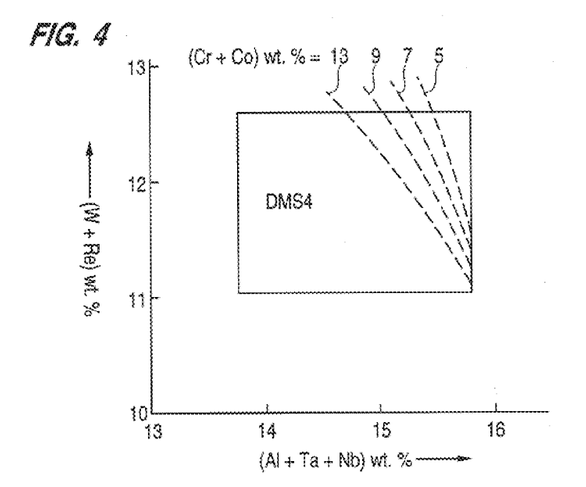
FIG. 4 is a graph of the phase stability field of alloys.

The selection of the alloying elements in this ranges has led to an improved ability to heat treat the cast articles inspite of higher total refractory elements relative to the columnar grained alloys of the prior art. It has been possible to achieve increasingly higher total refractory element content and avoid deleterious phase field by lowering the Cr+Co content as shown in FIG. 4. The as-cast micro-structure of the resulting article contains Y'—precipitates in a variety of sizes from very fine in the dendrite-core to very coarse near the dendrite-edge and in the inter-dendrite eutectic phase Y–Y'. The preferred micro structure of the article, after heat treatment, is an array of precipitates in a matrix together with carbides as illustrated in FIG. 3. The matrix is nickel along with the solid solution strengthening elements and is termed as Y phase. In addition to solid solution strengthening, the strength of the article is promoted by precipitation hardening. The precipitates are formed as an inter metallic compound of Ni, Al, Ta, Hf and Nb, the being known as Y' phase having a composition as Ni3 (Al, Ta, Hf, Nb). A solution heat treatment dissolves the matrix-Y' and eutectic Y'-phase into the Y-matrix and then an ageing treatment is performed to reprecipitate the Y'-phase in somewhat uniform size and distribution. Effective solutionization of the Y'-phase requires heating the article at a temperature which is above the Y'-solvus temperature, but below the alloy incipient melting temperature for sufficient duration. The choice of the ranges of the alloying elements have led to the highest ever solvus temperature as compared to all the columnar grained alloys of the prior art and yet, the same is about 15° C. lower than the incipient melting temperature of the alloy so that solutionization treatment can be carried out in commercial furnaces without causing any trace of melting of the article.

The invention will be more clearly understood from the following representative examples of the preparation of Ni-based columnar grained superalloy components which are not intended to be in any way a limitation on the scope of the present invention.

EXAMPLES

For preparation of 5 Kg of a Ni-based superalloy designated as DMD-5 (table-1) and columnar grained gas turbine blades, vanes and test-pieces therefrom, an alloy charge of 120 gm of Cr, 200 gm of Co, 275 gm of W,325 gm of Re,400 gm of Ta, 15 gm of Nb, 60 gm of Hf, 2 gm of Y, 259 gm of Al, 3.5 gm of C, 0.5 gm of B and balance Ni is prepared. The alloy charge is melted in the vacuum induction melting furnace at a temperature around 1500° C. The molten alloy is poured into ceramic mould (prepared as per step (c) of the process) pre-heated to 1500° C. Each mould has provision for casting multiple articles. Specifically, the mould has provision for three rectangular slabs, each having a length of 2.00 mm, a breadth of 30 mm, and a width of 10 mm and two gas turbine parts having configuration generally similar to that illustrated in FIGS. 1 & 2. The mould containing molten alloy is gradually withdrawn at a controlled rate across a desired temperature gradient to induce directional solidification of the molten alloy.

The cast components are removed and cleaned and are subjected to a multi-step solution heat treatment and brazing as per the above description in step (f) of the process. The solutionized and brazed components are subjected to multi-step ageing treatment as per step (g) of the process. FIG. 3 illustrates the typical microstructure of the fully heat treated components. The Y'-precipitates occupy at least 65 volume percent and have generally well aligned cubic morphology with cube edges in a size range of about 0.3 to 0.7 $\mu$m.

Figure 6:
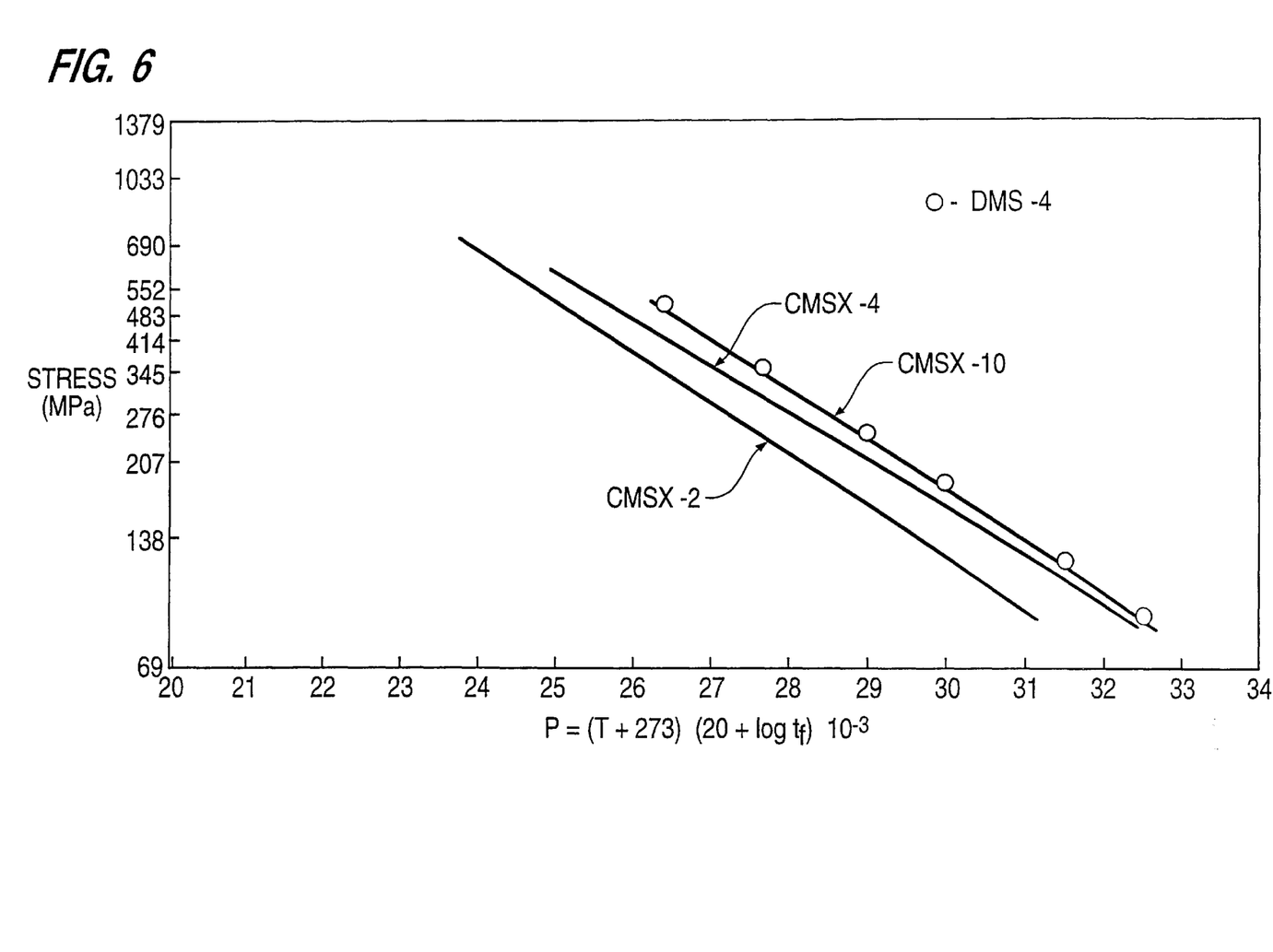
FIG. 6 is a graphical comparison of stress rupture data of this alloy with that of other alloys available for similar application.
Figure 7:
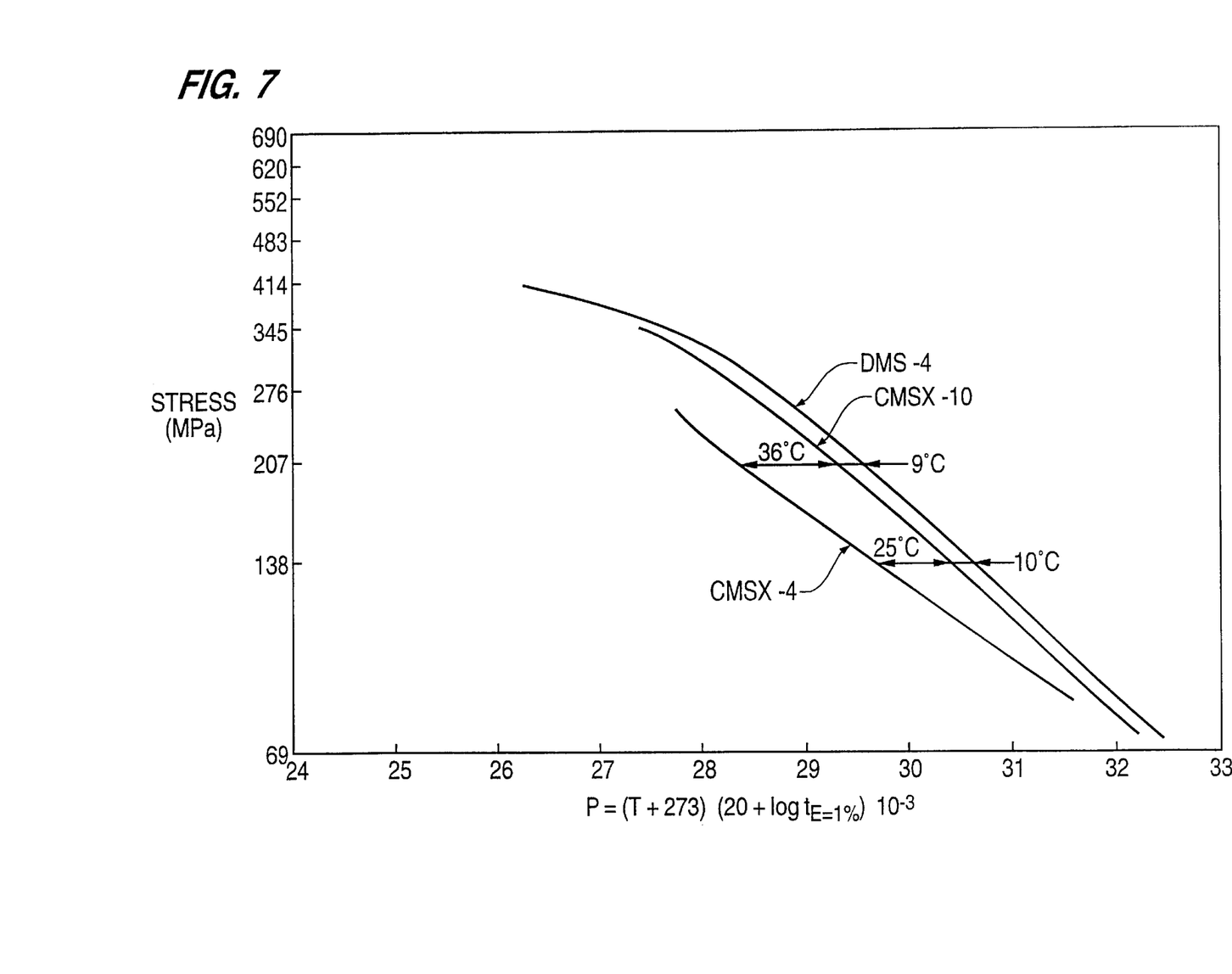
FIG. 7 is a graphical comparison of a Larson-Miller plot for 1% creep strain of this alloy with that of other alloys available for similar application.

The solution treated and aged samples of alloys DMD-1 to DMD-6, prepared by the process by taking corresponding weight % of different alloying elements as given in table-1 were characterized for creep, oxidation and hot-corrosion resistance. The creep rupture tests were carried out within temperature and tensile stress ranges of 850 to 1150° C. and 90 to 500 MPa respectively. The creep-rupture life of different alloys DMD-1 to DMD-6 in comparison to the reported creep-rupture life of the known alloys, is given in table-2. Comparision of DMD-4 with the columnar grained alloys of the prior art in the Larson-Miller graph of FIG. 6 shows alloy DMD-4 to be far superior to alloy CM 186 LC. In the average Larson-Miller graph for 1% creep strength (FIG. 7), DMD-4 can be seen to have about a 25 to 33° C. advantage over alloy CM 186 LC in terms of metal temperature capability. A creep strength is one of the most critical design parameters for application, such as gas turbine blades and vanes.

For characterization of bare oxidation and hot-corrosion behavior, test samples of 7 mm diameter and 4 mm thickness were used. Oxidation weight loss was evaluated after repeating thirty times the thermal cycle of heating a test piece at a temperature of 1100° C. in a crucible in air for 5 hours followed by air cooling to ambient temperature. Hot-corrosion weight loss was determined by immersing each test piece in a salt mixture of 75 weight % sodium sulphate and 25 weight % sodium chloride contained in a crucible at a temperature of 940° C. for 50 hours. Table-2 shows the average weight loss by hot-corrossion and value of oxidation weight loss for each of the DMD-1 to DMD-6 alloy along with the reported data for the columnar grained alloys of prior art. The table-2 shows that the most preferred range of alloy compositions (DMD-3 to DMD-5) can be seen in table 2 to have better creep characteristics and adequate resistance to oxidation and hot-corrosion as compared to the columnar grained alloys of, prior art.

For evaluation of the phase stability of different alloys DMD-1 to DMD-6, samples of each alloy composition were exposed to temperatures between 1000 to 1200° C. for about 1000 hours. The alloys having compositions within the preferred range of this invention, namely DMD-2 to DMD-5, exhibited excellent phase stability as no deleterious phase has formed. Sectioning of creep-ruptured samples also showed formation of no deleterious phase.

The test samples of alloys of the present invention were coated with an overlay coating applied by a low pressure plasma vapour deposition process and some samples were also coated with platinum aluminide coating. Excellent coating characteristics, microstructure and bond strength have been obtained with both coating processes.

The Ni-base columnar grained superalloy articles, such as gas turbine blades and vanes, prepared by the disclosed process in the present invention, have, improved combination of critical properties such as high temperature creep resistance, hot-corrosion and oxidation resistance and excellent phase stability. Extermely complex cooling channels can be incorporated into these components without employing any ceramic core and without any compromise with aero-dynamic requirements of cooling channels that is usually inevitable in components made using ceramic cores.

Further, advantages of the present invention are:
 i) 25 to 33° C. higher temperature capability than that of the best columnar grained superalloy of the prior art.
 ii) excellent resistance to oxidation, hot corrosion and deleterious phase formation;
 iii) excellent castability of advanced gas turbine blades and vanes in columnar grain structure incorporating complex cooling channels, thin-walled aero-foils and shrouded segments;

iv) excellent heat treatability without causing any recrystallization; and v) convenient brazing and/or protective coating of the articles cast from this alloy by existing manufacturing techniques during heat treatment.

Although particular embodiments of the invention have been described in detail for the purpose of illustration, various modifications may be made without departing from the spirit and scope of the invention. Accordingly, the invention is not to be limited except as by the appended claims.

What is claimed is:

1. A process for preparing a Ni-based superalloy cast article, comprising:
   a. preparing an alloy charge comprised of
      from 1.4 to 4.4 wt. % of Cr,
      from 3 to 8 wt. % of Co,
      from 5 to 7.5 wt. % of W,
      from 4.8 to 7.5 wt. % of Re,
      from 6 to 9 wt. % of Ta,
      from 4.8 to 6 wt. % of Al,
      from 0.1 to 0.5 wt. % of Nb,
      from 0.8 to 1.8 wt. % of Hf,
      from 0.05 to 0.1 wt. % of C,
      from 0.01 to 0.05 wt. % of Y,
      from 0.005 to 0.15 wt. % of B, and
      balance Ni,
      wherein the sum of W+Re is about 12 wt. %, the sum of Al+Ta+Hf+Nb ranges from 13.6 to 15.6 wt. %, and the sum of W+Re+Ta+Hf+Nb ranges from 20.2 to 22.8 wt. %;
   b. melting the alloy charge in a furnace to provide an alloy melt;
   c. pouring the alloy melt into a mold having a plurality of cavities which define at least one pair of longitudinal halves of the article to be cast;
   d. withdrawing the mold containing the alloy melt from the furnace so as to induce solidification of the alloy melt to provide at least one pair of cast longitudinal halves of an article;
   e. removing the mold and cleaning the at least one pair of cast longitudinal halves;
   f. providing a brazing filler between the cast longitudinal halves of each pair of the at least one pair of cast longitudinal halves along their matching plane of slice to provide an assembly;
   g. subjecting each assembly to solution heat treatment and brazing to provide an article;
   h. quenching the article; and
   i. subjecting the article to a multi-step ageing treatment.

2. The process according to claim 1, further comprising preheating the mold in the furnace to a temperature of 1500° C.

3. The process according to claim 1, wherein melting the alloy charge includes heating the alloy charge to a temperature of 1500° C.

4. The process according to claim 1, wherein the furnace for melting the alloy charge is a vacuum induction melting furnace.

5. The process according to claim 1, wherein the mold containing the melt is gradually withdrawn from the furnace at a controlled rate across a preselected temperature gradient so as to induce directional solidification of the melt.

6. The process according to claim 1, wherein the alloy charge consists essentially of from 1.4 to 4.4 wt. % of Cr,
   from 3 to 8 wt. % of Co,
   from 5 to 7.5 wt. % of W,
   from 4.8 to 7.5 wt. % of Re,
   from 6 to 9 wt. % of Ta,
   from 4.8 to 6 wt. % of Al,
   from 0.1 to 0.5 wt. % of Nb,
   from 0.8 to 1.8 wt. % of Hf,
   from 0.05 to 0.1 wt. % of C,
   from 0.01 to 0.05 wt. % of Y,
   from 0.005 to 0.15 wt. % of B, and
   balance Ni.

7. The process according to claim 1, wherein the alloy charge consists of
   from 1.4 to 4.4 wt. % of Cr,
   from 3 to 8 wt. % of Co,
   from 5 to 7.5 wt. % of W,
   from 4.8 to 7.5 wt. % of Re,
   from 6 to 9 wt. % of Ta,
   from 4.8 to 6 wt. % of Al,
   from 0.1 to 0.5 wt. % of Nb,
   from 0.8 to 1.8 wt. % of Hf,
   from 0.05 to 0.1 wt. % of C,
   from 0.01 to 0.05 wt. % of Y,
   from 0.005 to 0.15 wt. % of B, and
   balance Ni.

8. The process according to claim 1, wherein the alloy charge provides an alloy having a solvus temperature and an incipient melting temperature, and wherein the solvus temperature of the alloy is about 15° C. lower than the incipient melting temperature of the alloy so that solution heat treatment causes no melting of the article.

9. The process according to claim 1, wherein the mold having a plurality of cavities which define at least one pair of longitudinal halves of the article to be cast further comprises bottom runners for connecting each respective pair of the at least one pair of longitudinal halves at the bottom of a central sprue through the bottom runners.

10. The process according to claim 1, wherein brazing occurs simultaneously with subjecting each assembly to solution heat treatment.

11. The process according to claim 1, wherein solution heat treatment is carried out at a temperature ranging from 1275 to 1295° C.

* * * * *

UNITED STATES PATENT AND TRADEMARK OFFICE
CERTIFICATE OF CORRECTION

PATENT NO. : 5,916,384
DATED : June 29, 1999
INVENTOR(S) : Niranjan DAS

It is certified that error appears in the above-identified patent and that said Letters Patent is hereby corrected as shown below:

On the title page, Item

[73] of the title page of the Patent, delete "The Controller, Research & Development Organization, New Delhi, India" and insert therefore -- The Chief Controller, Research & Development Organization, Ministry of Defence, Technical Coordination, New Delhi, India --

Signed and Sealed this

Twenty-fourth Day of October, 2000

Attest:

Q. TODD DICKINSON

*Attesting Officer*                *Director of Patents and Trademarks*